(12) United States Patent
Kwon

(10) Patent No.: US 11,615,819 B2
(45) Date of Patent: Mar. 28, 2023

(54) APPARATUS AND METHOD FOR IMPROVING DATA INPUT/OUTPUT SPEED OF NON-VOLATILE MEMORY DEVICE

(71) Applicant: SK hynix Inc., Gyeonggi-do (KR)

(72) Inventor: Lee Hyun Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/392,074

(22) Filed: Aug. 2, 2021

(65) Prior Publication Data

US 2022/0301600 A1 Sep. 22, 2022

(30) Foreign Application Priority Data

Mar. 18, 2021 (KR) .................. 10-2021-0035489

(51) Int. Cl.
*G11C 5/14* (2006.01)
*G11C 16/30* (2006.01)

(52) U.S. Cl.
CPC .............. *G11C 5/145* (2013.01); *G11C 5/147* (2013.01); *G11C 16/30* (2013.01)

(58) Field of Classification Search
CPC .......... G11C 5/145; G11C 5/147; G11C 16/30
See application file for complete search history.

(56) References Cited

U.S. PATENT DOCUMENTS

| 10,833,580 B2 | 11/2020 | Piccardi et al. |
| 2003/0034743 A1* | 2/2003 | Chen ..................... H05B 41/282 |
| | | 315/247 |
| 2006/0202741 A1* | 9/2006 | Tran ....................... H02M 1/36 |
| | | 327/536 |
| 2009/0167418 A1* | 7/2009 | Raghavan ............. H02M 3/073 |
| | | 327/536 |
| 2017/0162273 A1* | 6/2017 | You ....................... G11C 16/349 |
| 2019/0064866 A1* | 2/2019 | Hsu .......................... G11C 7/20 |
| 2019/0130953 A1* | 5/2019 | Lee ....................... G06F 3/0679 |

FOREIGN PATENT DOCUMENTS

KR 10-1065818 B1 9/2011

\* cited by examiner

*Primary Examiner* — John W Poos
*Assistant Examiner* — Tyler J Pereny
(74) *Attorney, Agent, or Firm* — IP & T Group LLP

(57) ABSTRACT

A voltage generation circuit includes a noise attenuation circuit configured to attenuate a noise of a second power voltage which has a level that is at least two times higher than that of a first power voltage, and a multi-stage voltage pump configured to receive a noise-attenuated second power voltage from the noise attenuation circuit and generate at least one of plural target voltages, each target voltage having a different level. The first and second power voltages are individually input from an external device via different pins or pads.

14 Claims, 10 Drawing Sheets

APPARATUS AND METHOD FOR IMPROVING DATA INPUT/OUTPUT SPEED OF NON-VOLATILE MEMORY DEVICE

CROSS-REFERENCE TO RELATED APPLICATIONS

This patent application claims the benefit of Korean Patent Application No. 10-2021-0035489, filed on Mar. 18, 2021, the entire disclosure of which is incorporated herein by reference.

TECHNICAL FIELD

One or more embodiments of the present disclosure described herein relate to an apparatus and method for improving data input/output speed of a non-volatile memory device.

BACKGROUND

While technologies for processing data quickly and safely are attracting attention, development of storage class memory (SCM) and related technologies, which have only the advantages of conventional dynamic random-access memory (DRAM) and flash memory, is being actively conducted. Storage class memory (SCM) has a data processing speed like that of DRAM, but data does not disappear even if supplied power is interrupted or off. Storage class memory (SCM) can improve system speed many times faster. Using this storage class memory, technologies are developed to handle the increasing data traffic more quickly and efficiently with commercialization of artificial intelligence (AI), big data, and the Internet of Things (IoT).

BRIEF DESCRIPTION OF THE DRAWINGS

The description herein makes reference to the accompanying drawings wherein like reference numerals refer to like parts throughout the figures.

DETAILED DESCRIPTION

Figure 1:
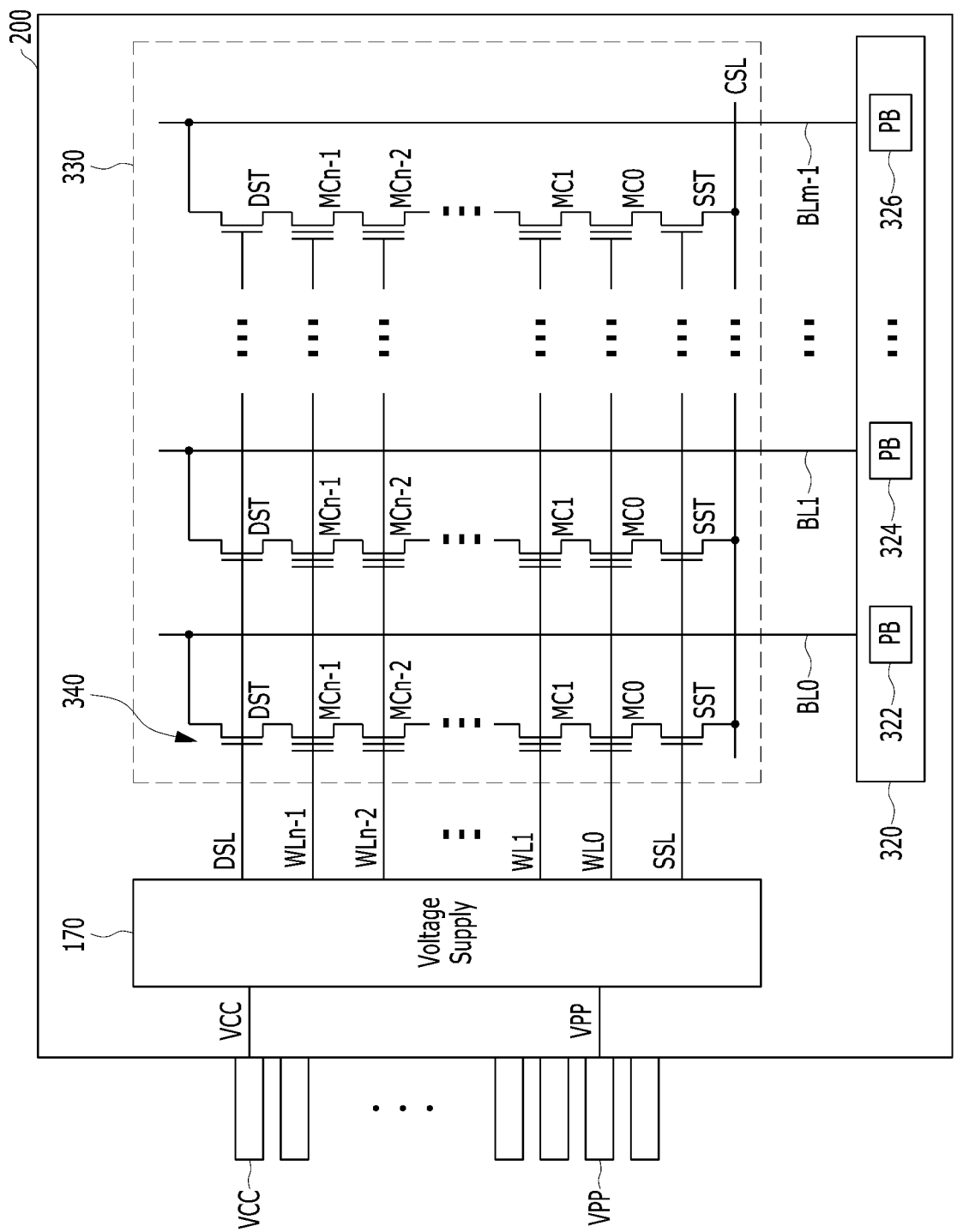
FIG. 1 illustrates a memory device according to an embodiment of the present disclosure.

Various embodiments of the present disclosure are described below with reference to the accompanying drawings. Elements and features of the present disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or portion of a processor and its (or their) accompanying software and/or firmware. The term "circuitry" or "logic" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

An embodiment of the present disclosure can provide a data process system and a method for improving data input/output speed.

An embodiment of the present disclosure can provide an apparatus and method capable of increasing a data input/output speed of a non-volatile memory device such as a flash memory. In order to increase the data input/output speed, the non-volatile memory device can reduce a time spent on generating a high voltage used for the read or write operation of the non-volatile memory device, to reduce an operation margin for a read or write operation.

The non-volatile memory device can include a voltage generation circuit. The voltage generation circuit can include a rectifier circuit or a filter circuit configured to avoid or reduce a noise included in a high voltage input from an external device via a pin or a pad, and a multi-stage pump configured to generate high voltages having a different level used in the read or write operation. Further, the voltage generation circuit can include a diode configured to avoid malfunction due to a high voltage applied to each unit voltage pump in the multi-stage pump.

In an embodiment of the present disclosure, the non-volatile memory device can include a number of data buses for increasing the data input/output speed. When the number of data buses used for transferring a data item from or to page buffers is increased and each page buffer is individually connected to another component via each data bus, the data input/output speed can be improved.

In an embodiment, a voltage generation circuit can include a noise attenuation circuit configured to attenuate a noise of a second power voltage which has a level that is at least two times higher than that of a first power voltage, wherein the first and second power voltages are individually input from an external device via different pins or pads; and a multi-stage voltage pump configured to receive a noise-attenuated second power voltage from the noise attenuation circuit and generate at least one of plural target voltages, each target voltage having a different level.

The multi-stage voltage pump can include plural unit voltage pumps, serially connected to each other and configured to receive the second power voltage; and at least one diode including a cathode coupled between an output terminal and an input terminal of neighboring unit voltage pumps of the plural unit voltage pumps and an anode coupled to the second power voltage.

The at least one diode can be configured to maintain a voltage level on the output terminal and the input terminal of the neighboring unit voltage pumps to avoid application of a breakdown voltage of a transistor included in the neighboring unit voltage pumps.

The noise attenuation circuit can be always coupled to the pins or pads while the voltage generation circuit generates the at least one of the plural target voltages.

The noise attenuation circuit can include a rectifier including a diode arranged between input and output terminals and a capacitor coupled to the output terminal.

The noise attenuation circuit can include a low pass filter including a resistor arranged between input and output terminals and a capacitor coupled to the output terminal.

The plural target voltages can include a program voltage used for programming a data item in a non-volatile memory cell; an erase voltage used for erasing the data item in the non-volatile memory cell; and a read voltage used for reading the data item in the non-volatile memory cell.

In another embodiment, a memory device can include a memory group including a plurality of non-volatile memory cells; a voltage generation circuit configured to generate at least one of plural target voltages used for inputting or outputting a data item to or from the memory group; and plural buffers configured to temporarily store the data item output from the memory group or to be input to the memory group. The voltage generation circuit can include a noise attenuation circuit configured to attenuate a noise of a second power voltage which has a level that is at least two times higher than that of a first power voltage, wherein the first and second power voltages are individually input from an external device via different pins or pads; and a multi-stage voltage pump configured to receive a noise-attenuated second power voltage from the noise attenuation circuit and generate the at least one of plural target voltages, each target voltage having a different level.

The multi-stage voltage pump can include plural unit voltage pumps, serially connected to each other and configured to receive the second power voltage; and at least one diode including a cathode coupled between an output terminal and an input terminal of neighboring unit voltage pumps of the plural unit voltage pumps and an anode coupled to the second power voltage.

The at least one diode can be configured to maintain a voltage level on the output terminal and the input terminal of the neighboring unit voltage pumps to avoid application of a breakdown voltage of a transistor included in the neighboring unit voltage pumps.

The noise attenuation circuit can be always coupled to the pins or pads while the voltage generation circuit generates the at least one of the plural target voltages.

The noise attenuation circuit can include a rectifier including a diode arranged between input and output terminals and a capacitor coupled to the output terminal.

The noise attenuation circuit can include a low pass filter including a resistor arranged between input and output terminals and a capacitor coupled to the output terminal.

The plural target voltages can include a program voltage used for programming a data item in a non-volatile memory cell; an erase voltage used for erasing the data item in the non-volatile memory cell; and a read voltage used for reading the data item in the non-volatile memory cell.

The plural buffers can be coupled to the first power voltage and a first ground voltage corresponding to the first power voltage, while the multi-stage voltage pump is coupled to the second power voltage and a second ground voltage corresponding to the second power voltage. A node of the first ground voltage can be electrically isolated from a node of the second ground voltage.

The plural buffers can be coupled to respective bit lines of the memory group. The plural buffers can be coupled to respective buses to transfer the data item output from the memory group.

The plural buffers can be coupled to a data serializer via the respective buses, and the plural buffers transfer the data item via the respective buses without any wait time.

In another embodiment, a semiconductor device can include a first pin or pad configured to receive a first power voltage input from an external device; a second pin or pad configured to receive a second power voltage input from an external device, wherein the second power voltage has a level that is at least two times higher than that of a first power voltage; a multi-stage voltage pump configured to receive the second power voltage and generate at least one of plural target voltages, each target voltage having a different level; and a noise attenuation circuit, arranged between the second pin or pad and the multi-stage voltage pump, and configured to attenuate a noise of the second power voltage.

The multi-stage voltage pump can include plural unit voltage pumps, serially connected to each other and configured to receive a noise-attenuated second power voltage; and at least one diode including a cathode coupled between an output terminal and an input terminal of neighboring unit voltage pumps of the plural unit voltage pumps and an anode coupled to the second power voltage.

The at least one diode can be configured to maintain a voltage level on the output terminal and the input terminal of the neighboring unit voltage pumps to avoid application of a breakdown voltage of a transistor included in the neighboring unit voltage pumps.

In another embodiment, a memory device can include a voltage generation circuit configured to receive first and second power voltages to generate first and second operating voltages, respectively, the second power voltage having a higher level twice or more than the first power voltage; and a memory core configured to perform operations respectively with the first and second operating voltages, wherein the voltage generation circuit includes: a noise attenuation circuit configured to attenuate a noise of the second power voltage; two or more serially coupled unit voltage pumps configured to receive the noise-attenuated second power voltage to generate the second operating voltage; and at least one diode, of which an anode is coupled to a node of the noise-attenuated second power voltage, and a cathode is coupled to connection of adjacent voltage pumps of the unit voltage pumps.

Embodiments of the present disclosure will now be described with reference to the accompanying drawings, wherein like numbers reference like elements.

FIG. 1 illustrates a memory system 110 according to an embodiment of the present disclosure. Specifically, FIG. 1 schematically illustrates a memory cell array circuit in a memory die included in a memory device according to an embodiment of the present disclosure.

Referring to FIG. 1, a memory die 200 can include a memory group 330 including a plurality of non-volatile memory cells. The memory group 330 can include a plurality of cell strings 340. The cell string 340 includes plural non-volatile memory cells connected to each of plural bit lines BL0 to BLm-1. The cell string 340 disposed in each column of the memory group 330 can include at least one drain select transistor DST and at least one source select transistor SST. A plurality of non-volatile memory cells or memory cell transistors MC0 to MCn-1 may be connected in series between the drain and source select transistors DST, SST. For example, each of the non-volatile memory cells MC0 to MCn-1 may be configured as a multi-level cell (MLC) that stores a data item having plural bits per cell. The cell strings 340 may be electrically connected to the corresponding bit lines BL0 to BLm-1, individually.

FIG. 1 shows the memory group 330 including NAND-type flash memory cells as an example. However, the memory group 330 included in a memory device 150 according to an embodiment of the present disclosure may not be limited to the NAND-type flash memory. In another embodiment, the memory group 330 can also be implemented as a NOR-type flash memory, a hybrid flash memory in which at least two different types of memory cells are mixed or combined, or a one-chip NAND flash memory in which a controller is embedded in a single memory chip. In addition, the memory group 330 according to an embodiment of the present disclosure can include a flash memory cell in which a charge trap flash (CTF) layer including a conductive floating gate or insulating layer is included.

Figure 2:
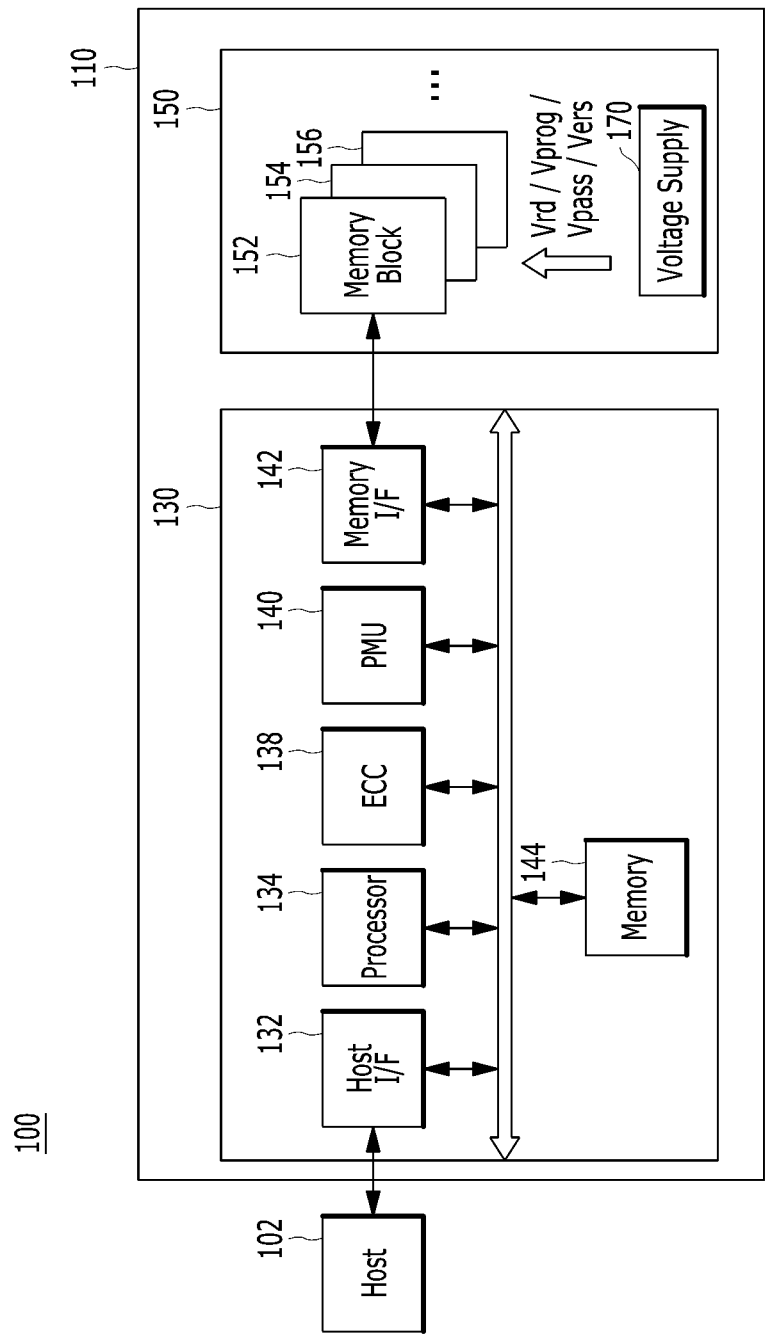
FIG. 2 illustrates a data processing system according to an embodiment of the present disclosure.

According to an embodiment of the present disclosure, the memory group 330 shown in FIG. 1 may include at least one memory block 152, 154, 156 included in the memory device 150 shown in FIG. 2. According to an embodiment, the memory die 200 can include a memory device having a two-dimensional (2D) or three-dimensional (3D) structure. For example, each of the memory blocks 152, 154, 156 in the memory device 150 may be implemented as a 3D structure (or a vertical structure). Each of the memory blocks 152, 154, 156 may have a three-dimensional structure extending along first to third directions, for example, an x-axis direction, a y-axis direction, and a z-axis direction.

The memory group 330 constituting the plurality of memory blocks 152, 154, 156 of the memory device 150 can be coupled to a plurality of bit lines BL, a plurality of string select lines SSL, and a plurality of drain select lines DSL, a plurality of word lines WL, a plurality of dummy word lines DWL, and a plurality of common source lines CSL. The memory group 300 can include a plurality of NAND strings NS, each NAND string NS including a plurality of memory cells MC. In the memory group 330, each of the NAND strings NS may be connected to each bit line BL. In addition, the string select transistor SST of each NAND string NS may be connected to a common source line CSL, and the drain select transistor DST of each NAND string NS can be connected to a corresponding bit line BL. Here, the memory cells MC may be arranged between the string select transistor SST and the drain select transistor DST of each NAND string NS.

A voltage supply circuit 170 in the memory die 200 can supply a word line voltage (e.g., a subject voltage such as a program voltage, a read voltage, and a pass voltage) via each word line according to an operation mode, or supply a voltage to a bulk (e.g., a well region) in which each memory block including the memory cells MC are formed. In this case, a voltage generating operation of the voltage supply circuit 170 may be performed under a control of a control circuit (not shown). Also, the voltage supply circuit 170 may generate a plurality of variable read voltages to distinguish a plurality of data items from each other. In response to the control of the control circuit, one of the memory blocks (or sectors) of the memory cell array may be selected, and one of the word lines of the selected memory block may be selected. Word line voltages may be supplied to the selected word line and the unselected word line, individually. The voltage supply circuit 170 may include a voltage generation circuit (refer to FIGS. 4 to 8) for generating target voltages having various levels. The voltage supply circuit 170 may be coupled to a first pin or pad receiving a first power voltage VCC applied from the outside (e.g., an external device) and a second pin or pad receiving the second power voltage VPP applied from the external device. Here, the second power voltage VPP may have a voltage level twice or more higher than that of the first power voltage VCC. For example, the first power voltage VCC may have a voltage level of 2.0V to 5.5V, while the second power supply voltage may have a voltage level of 9V to 13V. The voltage supply circuit 170 according to an embodiment of the present disclosure can include a voltage generation circuit for more rapidly generating the target voltages of various levels used in the memory group 330. The voltage generation circuit can use the second power supply voltage VPP to generate a target voltage which has a higher voltage level than the second power voltage VPP.

A read/write circuit 320 controlled by the control circuit of the memory die 200 may operate as a sense amplifier or a write driver according to an operation mode. The read/write circuit 320 is coupled to the first power voltage VCC and a first ground voltage corresponding to the first power voltage VCC. For example, in a verify operation and a read operation, the read/write circuit 320 may operate as a sense amplifier for reading the data item from the memory cell array. Also, in a program operation, the read/write circuit 320 may operate as a write driver that controls potentials of bit lines according to a data item to be stored in the memory cell array. The read/write circuit 320 may receive the data item to be programmed to the cell array from page buffers (not shown) during the program operation. The read/write circuit 320 can drive bit lines based on the input data item. To this end, the read/write circuit 320 includes a plurality of page buffers (PB) 322, 324, 326, each page buffer corresponding to each column (or each bit line) or each column pair (or each bit line pair). According to an embodiment, a plurality of latches (not shown) may be included in each of the page buffers 322, 324, 326.

Although not shown, the page buffers 322, 324, 326 may be coupled to a data input/output device (e.g., a serialization circuit or a serializer) through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without no waiting time.

FIG. 2 illustrates a data processing system according to an embodiment of the present disclosure.

Referring to FIG. 2, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

As shown in FIG. 2, the memory device 150 may include a plurality of memory blocks 152, 154, 156. The memory block 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block may include a plurality of pages.

According to an embodiment, the memory device 150 can include the memory die 200 shown in FIG. 1. For example, the memory device 150 may include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange an item of data and a signal with the controller 130.

According to an embodiment, the memory device 150 may include at least one memory block 152, 154, 156, at least one memory plane, or at least one memory die. The internal configuration of the memory device 150 shown in FIG. 1 may be different according to performance of the memory system 110. An embodiment of the present disclosure is not limited to the internal configuration shown in FIG. 2.

Referring to FIG. 2, the memory device 150 may include the voltage supply circuit 170 capable of supplying at least some voltage into the memory block 152, 154, 156. The voltage supply circuit 170 can include a voltage generation circuit used for generating target voltages used in the memory block 152, 154, 156, referring to FIGS. 4 to 8. The voltage supply circuit 170 may supply a read voltage Vrd, a program voltage Vprog, a pass voltage Vpass, or an erase voltage Vers into a non-volatile memory cell included in the memory block. For example, during a read operation for reading data stored in the non-volatile memory cell included in the memory block 152, 154, 156, the voltage supply circuit 170 may supply the read voltage Vrd into a selected non-volatile memory cell. During the program operation for storing data in the non-volatile memory cell included in the memory block 152, 154, 156, the voltage supply circuit 170 may supply the program voltage Vprog into a selected non-volatile memory cell. Also, during a read operation or a program operation performed on the selected nonvolatile memory cell, the voltage supply circuit 170 may supply a pass voltage Vpass into a non-selected nonvolatile memory cell. During the erasing operation for erasing data stored in the non-volatile memory cell included in the memory block 152, 154, 156, the voltage supply circuit 170 may supply the erase voltage Vers into the memory block.

The memory device 150 may store information regarding various voltages which are supplied to the memory block 152, 154, 156 based on which operation is performed. For example, when a non-volatile memory cell in the memory block 152, 154, 156 can store multi-bit data, plural levels of the read voltage Vrd for recognizing or reading the multi-bit data item may be required. The memory device 150 may include a table including information corresponding to plural levels of the read voltage Vrd, corresponding to the multi-bit data item. For example, the table can include bias values stored in a register, each bias value corresponding to a specific level of the read voltage Vrd. The number of bias values for the read voltage Vrd that is used for a read operation may be limited to a preset range. Also, the bias values can be quantized.

The host 102 may include a portable electronic device (e.g., a mobile phone, an MP3 player, a laptop computer, etc.) or a non-portable electronic device (e.g., a desktop computer, a game player, a television, a projector, etc.). According to an embodiment, the host 102 can include a central processing unit (CPU) included in the portable electronic device and the non-portable electronic device.

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to the plurality of commands within the memory system 110.

A controller 130 in the memory system 110 may control a memory device 150 in response to a request or a command input from the host 102. For example, the controller 130 may perform a read operation to provide data read from the memory device 150 to the host 102 and may perform a write operation (or a program operation) to store data input from the host 102 in the memory device 150. In order to perform data input/output (I/O) operations, the controller 130 may control and manage internal operations of reading data, programming data, erasing data, or the like.

According to an embodiment, the controller 130 may include a host interface 132, a processor 134, error correction circuitry (ECC) 138, a power management unit (PMU) 140, a memory interface 142, and a memory 144. Components included in the controller 130 as illustrated in FIG. 2 may vary according to structures, functions, operation performance, or the like, regarding the memory system 110.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from the controller 130 according to implementation of the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus capable of transmitting signals, data, and the like to the host 102 or receiving signals, data, and the like from the host 102.

The host interface 132 included in the controller 130 may receive signals, commands (or requests), and/or data input from the host 102. For example, the host 102 and the memory system 110 may use a predetermined communication standard to transmit and receive data therebetween. Examples of communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe), Serial-attached SCSI (SAS), Serial Advanced Technology Attachment (SATA), Mobile Industry Processor Interface (MIPI), and the like. According to an embodiment, the host interface 132 is a type of layer for exchanging data with the host 102 and is implemented with, or driven by, firmware called a host interface layer (HIL).

The Integrated Drive Electronics (IDE) or Advanced Technology Attachment (ATA) may be used as one of the interfaces for transmitting and receiving data and, for example, may use a cable including 40 wires connected in parallel to support data transmission and data reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as a main memory device. The IDE (ATA) may include, for example, Fast-ATA, ATAPI, or Enhanced IDE (EIDE).

A Serial Advanced Technology Attachment (SATA) interface is a type of serial data communication interface that is compatible with various ATA standards of parallel data communication interfaces which are used by Integrated Drive Electronics (IDE) devices. The 40 wires in the IDE interface can be reduced to six wires in the SATA interface. For example, 40 parallel signals for the IDE can be converted into 6 serial signals for the SATA interface. The SATA interface has been widely used because of its faster data transmission and reception rate, and its less resource consumption in the host 102 used for the data transmission and reception. The SATA interface may connect up to 30 external devices to a single transceiver included in the host 102. In addition, the SATA interface can support hot plugging that allows an external device to be attached to or detached from the host 102, even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely attached to or detached from the host 102 like an external hard disk.

Small Computer System Interface (SCSI) is a type of serial data communication interface used for connecting a computer or a server with other peripheral devices. The SCSI can provide a high transmission speed, as compared with other interfaces such as IDE and SATA. In the SCSI, the host 102 and at least one peripheral device (e.g., memory system 110) are connected in series, but data transmission and reception between the host 102 and each peripheral device may be performed through a parallel data communication. In the SCSI, it is easy to connect or disconnect a device such as the memory system 110 to or from the host 102. The SCSI can support connections of 15 other devices to a single transceiver included in host 102.

Serial Attached SCSI (SAS) can be understood as a serial data communication version of the SCSI. In the SAS, the host 102 and a plurality of peripheral devices are connected in series, and data transmission and reception between the host 102 and each peripheral device may be performed in a serial data communication scheme. The SAS can support connection between the host 102 and the peripheral device through a serial cable instead of a parallel cable, to easily manage equipment using the SAS and enhance or improve operational reliability and communication performance. The SAS may support connections of eight external devices to a single transceiver included in the host 102.

The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second. The NVMe can support an operation speed of the non-volatile memory system 110, such as an SSD, that is faster than a hard disk.

According to an embodiment, the host 102 and the memory system 110 may be connected through a universal serial bus (USB). The Universal Serial Bus (USB) is a type of scalable, hot-pluggable plug-and-play serial interface that can provide cost-effective standard connectivity between the host 102 and peripheral devices such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above described codes. The error correction circuitry 138 shown in FIG. 2 can include at least some of the components included in the controller 130 shown in FIG. 1.

For example, the ECC decoder may perform hard decision decoding or soft decision decoding on data transmitted from the memory device 150. The hard decision decoding can be understood as one of two methods broadly classified for error correction. The hard decision decoding may include an operation of correcting an error bit by reading digital data of '0' or '1' from a non-volatile memory cell in the memory device 150. Because the hard decision decoding handles a binary logic signal, the circuit/algorithm design or configuration may be simpler and a processing speed may be faster than the soft decision decoding.

The soft decision decoding may quantize a threshold voltage of a non-volatile memory cell in the memory device 150 by two or more quantized values (e.g., multiple bit data, approximate values, an analog value, and the like) in order to correct an error bit based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values are finally determined as data of 1 or 0. For example, a decoding algorithm using LDPC codes can be understood as probabilistic decoding. The hard decision decoding in which a value output from a non-volatile memory cell is coded as 0 or 1. Compared to the hard decision decoding, the soft decision decoding can determine the value stored in the non-volatile memory cell based on the stochastic information. Regarding bit-flipping (which may be considered an error that can occur in the memory device 150), the soft decision decoding may provide improved probability of correcting the error and recovering data, as well as providing reliability and stability of corrected data. The LDPC-GM code may have a scheme in which internal LDPC-GM codes can be concatenated in series with high-speed LDPC codes.

According to an embodiment, the ECC decoder may use, for example, low-density parity-check convolutional codes (LDPC-CCs) for the soft decision decoding. The LDPC-CCs may have a scheme using a linear time encoding and a pipeline decoding based on a variable block length and a shift register.

According to an embodiment, the ECC decoder may use, for example, a Log Likelihood Ratio Turbo Code (LLR-TC) for the soft decision decoding. A Log Likelihood Ratio (LLR) may be calculated as a non-linear function for a distance between a sampled value and an ideal value. In addition, a Turbo Code (TC) may include a simple code (for example, a Hamming code) in two or three dimensions and repeat decoding in a row direction and a column direction to improve reliability of values.

The power management unit (PMU) 140 may control electrical power provided to the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but also generate a trigger signal to enable the memory system 110 to back up a current state urgently when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data of operations performed in the memory system 110 and the controller 130. For example, the memory 144 may temporarily store read data output from the memory device 150 in response to a read request from the host 102 before the read data is output to the host 102. In addition, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted between the controller 130 and the memory device 150 of the memory system 110 may be temporarily stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include one or more of a command queue, a program memory, a data memory, a write buffer/cache, a read buffer/cache, a data buffer/cache, a map buffer/cache, and so on. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). According to an embodiment, the processor 134 may be implemented with a microprocessor, a central processing unit (CPU), or the like.

According to an embodiment, the memory system 110 may be implemented with at least one multi-core processor. The multi-core processor is a type of circuit or chip in which two or more cores, which are considered distinct processing regions, are integrated. For example, when a plurality of cores in the multi-core processor drive or execute a plurality of flash translation layers (FTLs) independently, a data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may perform an operation independent from a command or a request input from the host 102. In one case, an operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In addition, a parameter set operation corresponding to a set parameter command or a set feature command as a set command transmitted from the host 102 may be considered a foreground operation. For example, as a background operation that is performed without a command transmitted from the host 102, the controller 130 can perform garbage collection (GC), wear leveling (WL), bad block management for identifying and processing bad blocks, or the like.

According an embodiment, substantially similar operations may be performed as both the foreground operation and the background operation. For example, when the memory system 110 performs garbage collection in response to a request or a command input from the host 102 (e.g., Manual GC), the garbage collection can be considered a foreground operation. When the memory system 110 performs garbage collection independently of the host 102 (e.g., Auto GC), the garbage collection can be considered a background operation.

When the memory device 150 includes a plurality of dies (or a plurality of chips) each including a plurality of non-volatile memory cells, the controller 130 may perform a parallel processing regarding plural requests or commands input from the host 102 in order to improve performance of the memory system 110. For example, the transmitted requests or commands may be divided into plural groups including at least some of a plurality of planes, a plurality of dies, or a plurality of chips included in the memory device 150, and the plural groups of requests or commands are processed individually or in parallel in each plane, each die or each chip.

The memory interface 142 in the controller 130 may be connected to the plurality of dies or chips in the memory device 150 through at least one channel and at least one way. When the controller 130 distributes and stores data in the plurality of dies through each channel or each way in response to requests or commands associated with a plurality of pages including non-volatile memory cells, a plurality of operations corresponding to the requests or the commands can be performed simultaneously or in parallel in the plurality of dies or planes. Such a processing method or scheme can be considered as an interleaving method. Because a data input/output speed of the memory system 110 increases by operating with the interleaving method, data I/O performance of the memory system 110 can be improved.

By way of example but not limitation, the controller 130 can recognize statuses of a plurality of channels (or ways) associated with the plurality of dies included in the memory device 150. The controller 130 may determine a status of each channel or each way as one of a busy status, a ready status, an active status, an idle status, a normal status, and an abnormal status. The determination of which channel or way an instruction (and/or a data) is delivered through by the controller can be associated with a physical block address. The controller 130 may refer to descriptors delivered from the memory device 150. The descriptors may include a block or page of parameters describing something about the memory device 150. The descriptors can have a predetermined format or structure. For instance, the descriptors may include device descriptors, configuration descriptors, unit descriptors, and the like. The controller 130 may refer to, or use, the descriptors to determine which channel(s) or way(s) is used to exchange an instruction or data.

Referring to FIG. 2, the memory device 150 in the memory system 110 may include a plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together.

In one embodiment, each memory block 152, 154, or 156 may have a three-dimensional stack structure for a high integration. Further, the memory device 150 may include a plurality of dies, each die including a plurality of planes, each plane including the plurality of memory blocks 152, 154, 156. A configuration of the memory device 150 may be changed depending on performance of the memory system 110.

FIG. 2 illustrates the memory device 150 that includes the plurality of memory blocks 152, 154, and 156. The plurality of memory blocks 152, 154, and 156 may be any of single-level cell (SLC) memory blocks, multi-level cell (MLC) memory blocks, or the like, according to the number of bits that can be stored in one memory cell. An SLC memory block includes a plurality of pages implemented by memory cells, each memory cell storing one bit of data. An SLC memory block may have higher data I/O operation performance and higher durability than the MLC memory block. The MLC memory block includes a plurality of pages implemented by memory cells, each memory cell storing multi-bit data (e.g., two or more bits of data). The MLC memory block may have larger storage capacity for the same space compared to the SLC memory block. The MLC memory block can be highly integrated in view of storage capacity.

In an embodiment, the memory device 150 may be implemented with MLC memory blocks such as a double level cell (DLC) memory block, a triple-level cell (TLC) memory block, a quadruple-level cell (QLC) memory block, and a combination thereof. The DLC memory block may include a plurality of pages implemented by memory cells, each memory cell capable of storing 2-bit data. The TLC memory block can include a plurality of pages implemented by memory cells, each memory cell capable of storing 3-bit data. The QLC memory block can include a plurality of pages implemented by memory cells, each memory cell capable of storing 4-bit data. In another embodiment, the memory device 150 can be implemented with a block including a plurality of pages implemented by memory cells, each memory cell capable of storing five or more bits of data.

According to an embodiment, the controller 130 may use a MLC memory block included in the memory device 150 as an SLC memory block that stores one-bit data in one memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. Thus, the controller 130 may use the MLC memory block as a SLC buffer to temporarily store data because the buffer may require a high data input/output speed for improving performance of the memory system 110.

Further, according to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored another-bit data.

In an embodiment, the memory device 150 is embodied as a non-volatile memory such as a flash memory, for example, as a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (SU-RAM), and a spin transfer torque magnetic random access memory (STT-MRAM), or the like.

Figure 3:
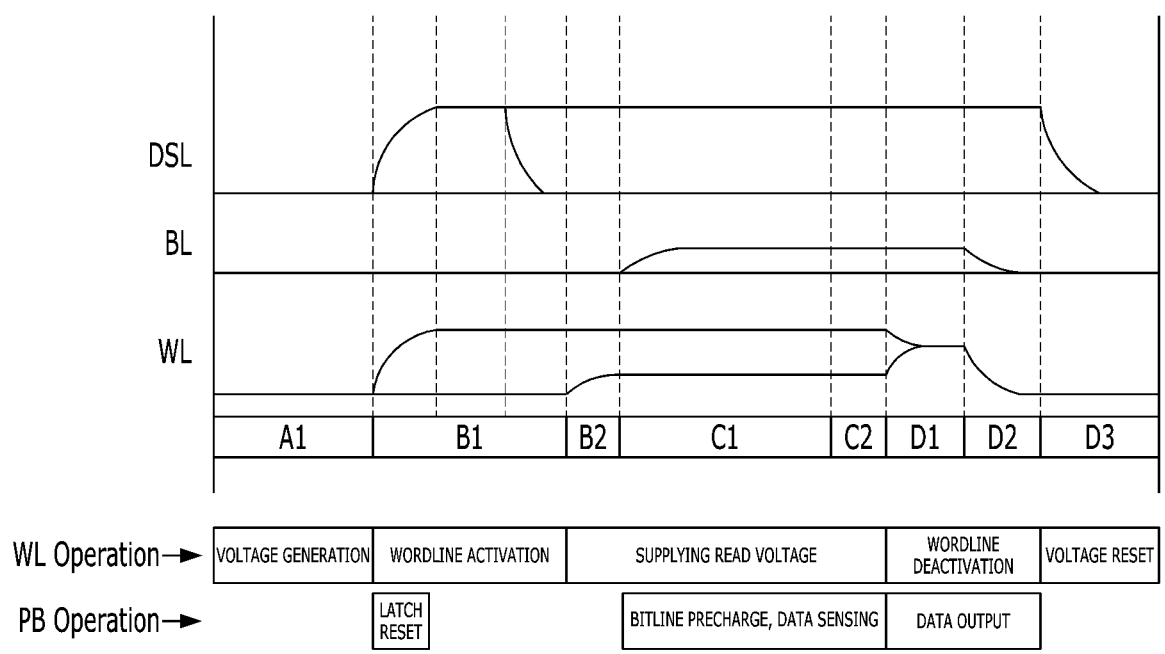
FIG. 3 illustrates a read operation in the memory device shown in FIG. 1 according to an embodiment of the present disclosure.

Referring to FIG. 3, the controller 130 in a memory system operates along with the host 102 and the memory device 150. As illustrated, the controller 130 includes the host interface 132, a flash translation layer (FTL) 240, the memory interface 142, and the memory 144 previously identified with reference to FIG. 2.

According to an embodiment, the error correction circuitry 138 illustrated in FIG. 2 may be included in the flash translation layer (FTL) 240. In another embodiment, the error correction circuitry 138 may be implemented as a separate module, a circuit, firmware, or the like, which is included in or associated with the controller 130.

The host interface 132 may handle commands, data, and the like transmitted from the host 102. By way of example but not limitation, the host interface 132 may include a command queue 56, a buffer manager 52, and an event queue 54. The command queue 56 may sequentially store the commands, the data, and the like received from the host 102, and output them to the buffer manager 52, for example, in an order in which they are stored in the command queue 56. The buffer manager 52 may classify, manage, or adjust the commands, the data, and the like received from the command queue 56. The event queue 54 may sequentially transmit events for processing the commands, the data, and the like received from the buffer manager 52.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or a commands for reading data, i.e., a read command, and a command for programming/writing data, i.e., a write command, may be alternately transmitted to the memory system 110. The host interface 132 may sequentially store commands, data, and the like, which are transmitted from the host 102, in the command queue 56. Thereafter, the host interface 132 may estimate or predict what type of internal operations the controller 130 will perform according to the characteristics of the commands, the data, and the like, which have been transmitted from the host 102. The host interface 132 may determine a processing order and a priority of commands, data and the like based on their characteristics.

According to the characteristics of the commands, the data, and the like transmitted from the host 102, the buffer manager 52 in the host interface 132 is configured to determine whether the buffer manager 52 should store the commands, the data, and the like in the memory 144, or whether the buffer manager 52 should deliver the commands, the data, and the like to the flash translation layer (FTL) 240. The event queue 54 receives events, transmitted from the buffer manager 52, which are to be internally executed and processed by the memory system 110 or the controller 130 in response to the commands, the data, and the like, and delivers the events to the flash translation layer (FTL) 240 in the order of the events input to the event queue 54.

FIG. 3 illustrates a read operation in the memory device shown in FIG. 1. Specifically, FIG. 3 focuses on operations performed in the memory device 150 or the memory die 200 in response to a read command or a read request transmitted from the controller 130.

Referring to FIG. 3, in order to read and output a data item stored in non-volatile memory cells of the memory device 150 or the memory die 200, the voltage supply circuit 170 may generate a read voltage used for a read operation (Section A1). Here, the read voltage may be applied through the word line WL connected to the non-volatile memory cells. The level of the read voltage can be differently set in response to a structure and design of the non-volatile memory cells, the number of data bits programmed in the non-volatile memory cell, and etc.

The memory device 150 can activate a word line WL corresponding to a specific location of the memory blocks 152, 154, 156 or the memory group 330 described FIGS. 1 to 2 (Section B1). In addition, the drain select line DSL connected to the drain select transistor DST of each NAND string described with reference to FIG. 1 is activated. Furthermore, a latch in the page buffer PB may be initialized for storing data transferred through the bit line BL. The memory device 150 can inactivate the drain select line DSL corresponding to unselected NAND string.

The read voltage Vread may be applied to a subjected word line corresponding to a location of the data item, and the pass voltage Vpass may be applied to other word lines except for the subjected word line (Section B2).

Then, the bit line BL can be precharged (Section C1). A channel in the NAND string can be differently formed based on a non-volatile memory cell. For example, the channel can vary according to data stored in the non-volatile memory cell connected to the word line to which a read voltage Vread is applied. The read voltage Vread can cause the change in a potential of the precharged bit line BL.

The read/write circuit 320 described with reference to FIG. 1 can sense or detect the change in the potential of the bit line BL (i.e., sensing data) and store sensed data in a latch of the page buffer PB (Section C2).

Thereafter, the word lines WL in the memory blocks 152, 154, 156 or the memory group 330 are inactivated (Sections D1 and D2). In this case, the sensed data stored in the latch of the page buffer PB may be transmitted to a transceiver (e.g., a serialization circuit or a serializer) for data transmission with the controller 130.

When the read operation is done, the drain select line DSL can be inactivated, and the voltage supply circuit 170 can reset a voltage used for the read operation (Section D3).

In the read operation described in FIG. 3, some sections (Sections B1, B2, C1, C2, D1) which are a time spent on operations of activating a word line, supplying a read voltage to the word line for sensing data, and deactivating the word line can be determined based on characteristics of the non-volatile memory cells in the memory device 150 or the memory die 200. When it is difficult to reduce an operation time for the sections (Sections B1, B2, C1, C2, D1), an interleaving method for reading and writing data from and to plural locations within the memory device 150 in parallel can be used to improve data input/output performance. For example, a large amount of data items can be divided into 2, 4, 8 or 16 partial data items, each data item corresponding to each area of 2, 4, 8 or 16 areas (e.g., dies, planes, etc.). Each area such as a die or a plane can perform a read operation or a write operation, individually. However, even when the interleaving scheme is adopted in the memory device 150, it might be difficult to reduce or decrease a time spent on operations (Sections A1, D3) for generating and resetting a target voltage used for the data input/output operation.

In order to improve a speed of the data input/output operation performed within the memory device 150 or the memory die 200, a voltage generation circuit according to an embodiment can be capable of reducing a time spent on the operations (Sections A1, D3) for generating and resetting the target voltage used for the data input/output operation. The voltage generation circuit is described below with reference to FIGS. 4 to 8.

Figure 4:
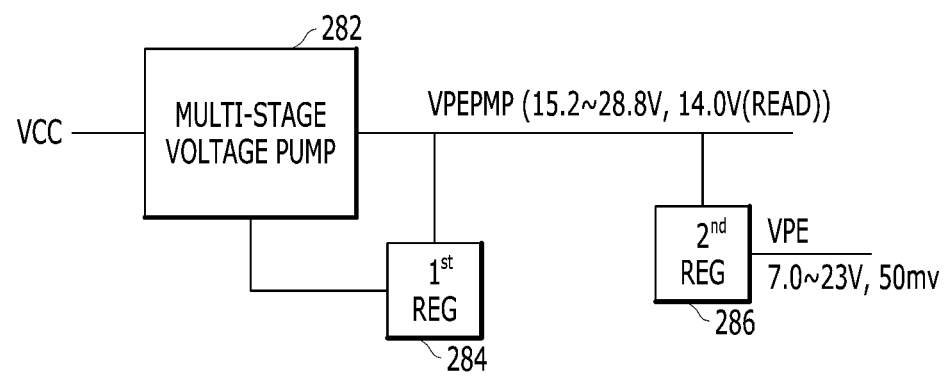
FIG. 4 illustrates a first example of a voltage generation circuit according to an embodiment of the present disclosure.
Figure 4:
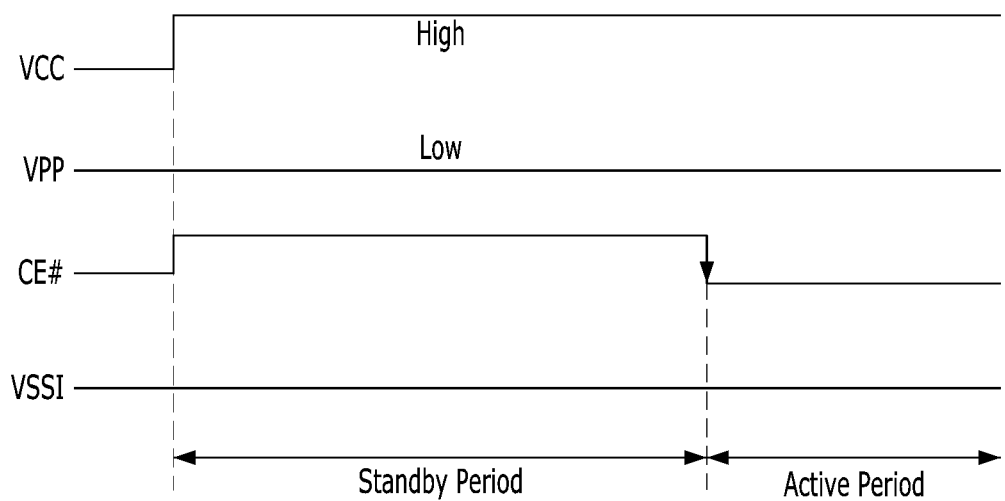

FIG. 4 illustrates a first example of a voltage generation circuit according to an embodiment of the present disclosure.

Referring to FIG. 4, the voltage generation circuit can include a first multi-stage voltage pump 282 capable of receiving a first power supply voltage VCC and generating a first pump generation voltage VPEPMP having various levels. Referring to FIG. 1, the memory die 200 may receive the first power supply voltage VCC and a second power supply voltage VPP via different pins or pads. The first multi-stage voltage pump 282 may receive the first power supply voltage VCC, which is used to generate the first pump generation voltage VPEPMP. However, the second power voltage VPP may not be used by the first multi-stage voltage pump 282. According to an embodiment, the first pump generation voltage VPEPMP may include a target voltage of 15.2 to 28.8V or 14V, which can be used for data input/output operation.

In addition, the voltage generation circuit can include a first voltage regulator 284 and a second voltage regulator 286 for maintaining the first pump generation voltage VPEPMP, output from the first multi-stage voltage pump 282, in a preset range. For example, the first voltage regulator 284 and the second voltage regulator 286 may maintain a voltage level between a ground voltage node VSSI and an output node of the first multi-stage voltage pump 282.

According to an embodiment, the first voltage regulator 284 can stabilize the first pump generated voltage VPEPMP of 15.2 to 28.8V or 14V, and the second voltage regulator 286 can output a first usage voltage VPE of 7 to 23V, based on the first pump generation voltage VPEPMP. Herein, the first pump generation voltage VPEPMP and the first usage voltage VPE may be selectively applied to the memory blocks 152, 154, 156 or the memory group 330, in response to an operation performed within the memory device 150 or the memory die 200.

As described in FIG. 1, because the first power supply voltage VCC has a lower level than the second power supply voltage VPP, the first multi-stage voltage pump 282 can require a preparation time or a setup period (Standby Period) to generate the first pump generation voltage VPEPMP having a high level of 15.2 to 28.8V or 14V. As a difference between a voltage input to the first multi-stage voltage pump 282 and a voltage output from the first multi-stage voltage pump 282 becomes greater, the preparation time or the setup time (Standby Period) can increase or become longer after an enable signal CE #is activated. When the preparation time or the setup time (Standby Period) become longer, an active period or a working section in which the voltage supply circuit 170 can use the target voltage VPE for the data input/output operation may be delayed. This may reduce the speed of the data input/output operation performed within the memory device 150 or the memory die 200.

Figure 5:
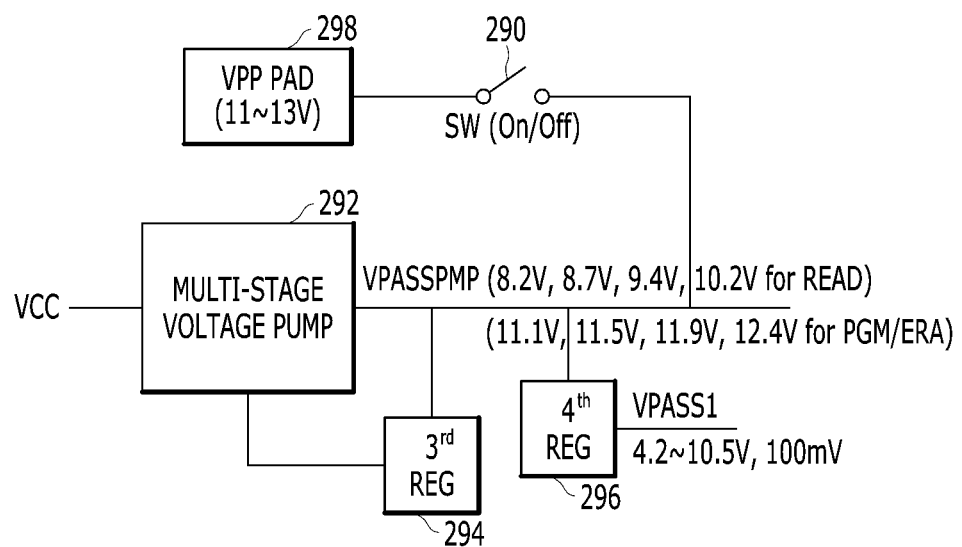
FIG. 5 illustrates a second example of the voltage generation circuit according to another embodiment of present disclosure.
Figure 5:
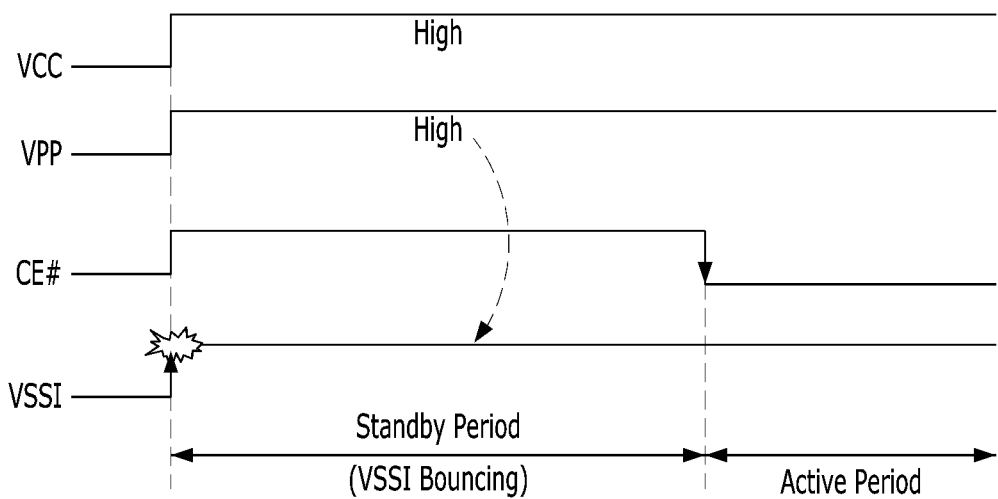

FIG. 5 illustrates a second example of the voltage generation circuit according to another embodiment of the present disclosure.

Referring to FIG. 5, the voltage generation circuit can include a second multi-stage voltage pump 292 capable of receiving the first power supply voltage VCC and generating a second pump generation voltage VPASSPMP having various levels. Referring to FIG. 1, the memory die 200 may receive a first power voltage VCC and a second power voltage VPP. The second multi-stage voltage pump 292 may use the first power voltage VCC to generate the second pump generation voltage VPASSPMP, and the second power voltage VPP of 11 to 13V is coupled to an output terminal of the second multi-stage voltage pump 292. According to an embodiment, the second pump generation voltage VPASSPMP can have a voltage level of 8 to 13V, which is used for the data input/output operation. For example, the second multi-stage voltage pump 292 may output target voltages of 8.2V, 8.7V, 9.4V, or 10.2V for a read operation, and/or target voltages of 11.1V, 11.5V, 11.9V or 12.4V for a write operation or an erase operation.

In addition, the voltage generation circuit can include a third voltage regulator 294 and a fourth voltage regulator 296 capable of maintaining and outputting the second pump generation voltage VPASSPMP, output from the second multi-stage voltage pump 292, in a preset range. For example, the first voltage regulator 294 and the second voltage regulator 296 may maintain a voltage level between the ground voltage node VSSI and an output node of the second multi-stage voltage pump 292.

According to an embodiment, the third voltage regulator 294 can stabilize or maintain the second pump generation voltage VPASSPMP of 8~13V. Further, the fourth voltage regulator 296 can select and output a second usage voltage VPASS1 of 4.2 to 10.5V, based on the second pump generation voltage VPASSPMP. Herein, the second pump generation voltage VPASSMP and the second usage voltage VPASS1 may be selectively applied to the memory block 152, 154, 156 or the memory group 330, in response to an operation performed within the memory device 150 or the memory die 200.

Further, the voltage generation circuit may include a switch 290 between a pin or pad 298 and an output terminal of the second multi-stage voltage pump 292. The second power voltage VPP of 11 to 13V is supplied via the pin or pad 298 from an external device. When the voltage generation circuit starts to operate, the switch 290 can instantaneously transfer the second power supply voltage VPP of a high level to the output terminal of the second multi-stage voltage pump 292 and an input terminal of the second voltage regulator 296, if an enable signal CE #is activated. In this case, due to the second power supply voltage VPP, a leakage current may occur through a transistor included in the second multi-stage voltage pump 292, the third voltage regulator 294, or the fourth voltage regulator 296. Due to this, the ground voltage node VSSI may bounce. Due to the leakage current, an amount of current consumed during the preparation time or the setup period (Standby Period) can increase.

In order to solve above-described issue, the voltage generation circuit can turn on the switch 290 after a certain time when the enable signal CE #is activated. When the switch 290 is turned on, the second power voltage VPP input via the pin or pad 298 can be supplied to an output terminal of the second multi-stage voltage pump 292. The switch 290 can be controlled for debouncing the ground voltage node VSSI (e.g., to avoid bouncing the ground voltage node VSSI).

As described with reference to FIG. 1, because the first power supply voltage VCC has a lower level than the second power supply voltage VPP, the second power supply voltage VPP of 11 to 13V can be supplied to the output terminal of the second multi-stage voltage pump 292, in order to avoid a longer preparation time or a set-up time (Standby Period) to output the second pump generation voltage VPASSPMP of 8 to 13V. However, the voltage generation circuit has an operational burden of controlling the switch 290 to avoid bouncing the ground voltage node VSSI. Also, the preparation time or the setup time (Standby Period) spent on outputting the second pump generation voltage VPASSPMP might be increased by a delay time spent on avoiding bouncing the ground voltage node VSSI. If the preparation time or the setup time (Standby Period) is increased, it is possible to delay the active period in which the voltage supply circuit 170 applies the second pump generation voltage VPASSMP and the second usage voltage VPASS1 to the memory blocks 152, 154, 156 or the memory group 330. Thus, the speed of a data input/output operation performed in the memory device 150 or the memory die 200 might be deteriorated.

Figure 6:
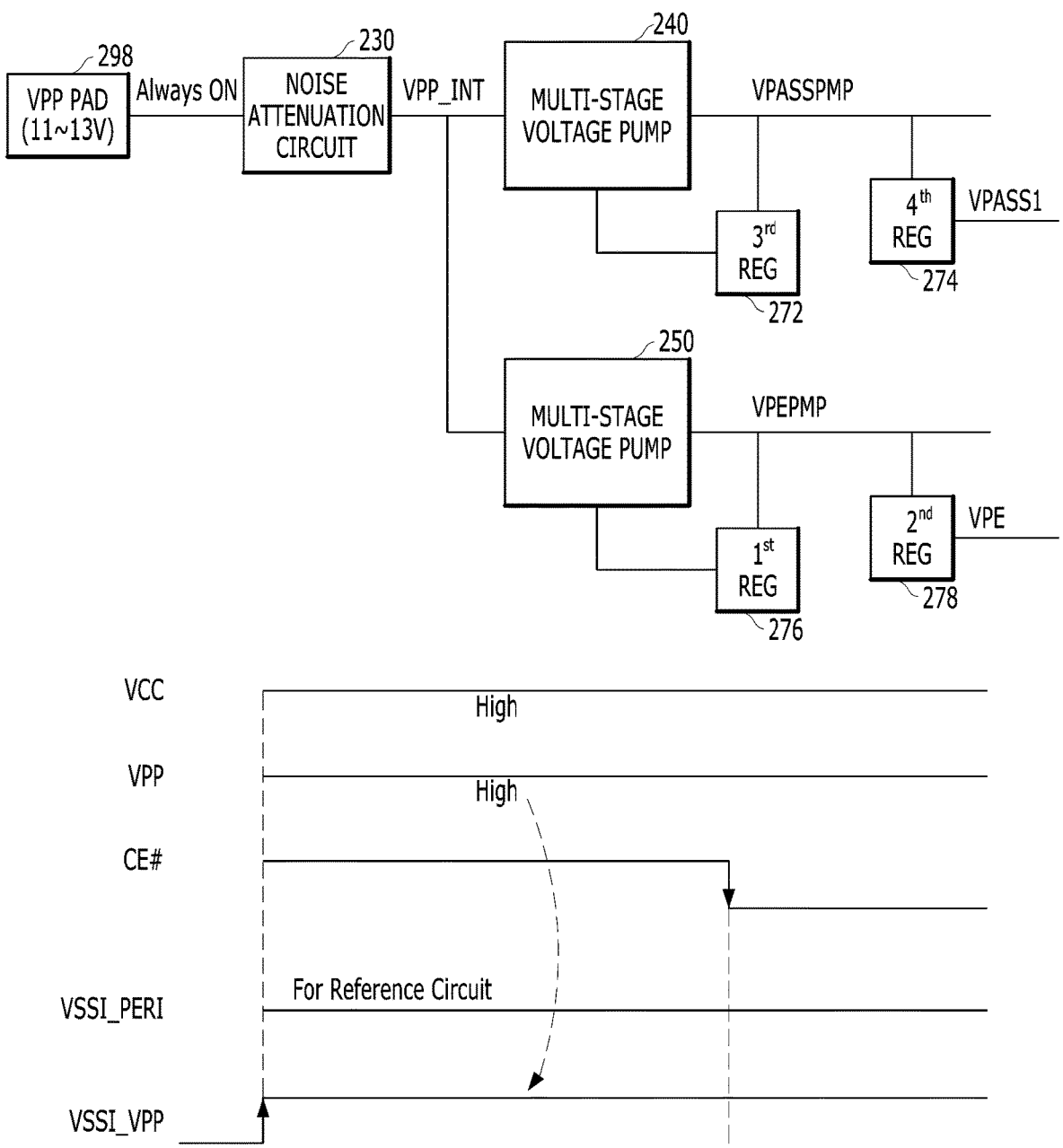
FIG. 6 illustrates a third example of the voltage generation circuit according to another embodiment of present disclosure.

FIG. 6 illustrates a third example of the voltage generation circuit according to another embodiment of the present disclosure.

Referring to FIG. 6, the voltage generation circuit can include a third multi-stage voltage pump 250 capable of generating the first pump generated voltage VPEPMP and a fourth multi-stage voltage pump 240 capable of generating the second pump generated voltage VPASSPMP. Although not shown, the second pump generated voltage VPASSPMP may have a voltage level of 25 to 30V. Unlike the first and second multi-stage voltage pumps 282, 292 described in FIGS. 4 to 5, the third and fourth multi-stage voltage pumps 250, 240 can use the second power voltage VPP other than the first power voltage VCC input from an external device, to generate the first pump generation voltage VPEPMP and the second pump generation voltage VPASSPMP. That is, the third and fourth multi-stage voltage pumps 250, 240 may be connected to a pin or pad 298 which the second power voltage VPP having a voltage level of 11 to 13V is supplied through.

According to an embodiment, the voltage generation circuit can include a first voltage regulator 276 and a second voltage regulator 278 configured to maintain and output the first pump generation voltage VPEPMP, output from the third multi-stage voltage pump 250, in a preset range. Further, the voltage generation circuit can include a third voltage regulator 272 and a fourth voltage regulator 274 configured to maintain and output the second pump generation voltage VPASSPMP, output from the fourth multi-stage voltage pump 240, in a preset range. The first to fourth voltage regulators 276, 278, 272, 274 illustrated in FIG. 6 can correspond to the first to fourth voltage regulators 284, 286, 294, 296 illustrated in FIGS. 4 and 5.

As described with reference to FIG. 1, the second power voltage VPP may have a voltage level twice or more higher than that of the first power voltage VCC. For example, the second power voltage VPP may have a voltage level of 11 to 13V, while the first power voltage VCC may have a voltage level of 2.0 to 2.5V. As described above, as voltage level differences between input terminals and output terminals of the third and fourth multi-stage voltage pumps 250, 240 increase, the preparation time or the setup time (Standby Period) of the third and fourth multi-stage voltage pumps 250, 240 might be increased. The third and fourth multi-stage voltage pumps 250, 240 described in FIG. 6 receive the second power supply voltage VPP having a voltage level of 11 to 13V, to output the first pump generation voltage VPEPMP and the second pump generation voltage VPASSPMP, so that a voltage level difference between the input terminals and the output terminals of the third and fourth multi-stage voltage pumps 250, 240 might be greatly reduced. Accordingly, the preparation time or the setup time (Standby Period) may be reduced.

When the second power voltage VPP having a voltage level of 11 to 13V is input to the third and fourth multi-stage voltage pumps 250, 240, a noise may be large. The noise of the power supply voltage increases as the voltage level of the power supply voltage increases. The second power voltage VPP can have larger noise than the first power voltage VCC because the power voltage VPP has a higher voltage level twice or more than that of the first power voltage VCC. Accordingly, the voltage generation circuit may include a noise attenuation circuit 230 between the pin or pad 298 supplied with the second power voltage VPP and the third and fourth multi-stage voltage pumps 250, 240.

The voltage generation circuit can be coupled to a second ground voltage node VSSI_VPP corresponding to the second power voltage VPP. Herein, the second ground voltage node VSSI_VPP may be electrically isolated from a first ground voltage node VSSI_PERI corresponding to the first power voltage VCC. Accordingly, it is possible to avoid destruction, loss, or malfunction of elements or components in a circuit disposed in a peripheral region of the memory device 150 and the memory die 200 due to bouncing or the like. In addition, according to an embodiment, in order to reduce electrical loads of the third and fourth multi-stage voltage pumps 250, 240, the second ground voltage node VSSI_VPP can be set to a preset positive voltage in response to the second power voltage VPP.

According to an embodiment, when a voltage level difference between the input terminal and the output terminal of the third or fourth multi-stage voltage pump 250, 240 of the voltage generation circuit become smaller, the number of unit voltage pumps included in the third or fourth multi-stage voltage pumps 250, 240 can be reduced. When the number of unit voltage pumps is reduced, an amount of current consumed in the voltage generation circuit can be reduced, and a size (e.g., an occupied area in a chip) of the voltage generation circuit can be also reduced.

Further, the third and fourth multi-stage voltage pumps 250, 240 in the voltage generation circuit are coupled not to the first power voltage VCC and the first ground voltage node VSSI_PERI but to the second power voltage VPP and the second ground voltage node VSSI_VPP, an additional switching component (e.g., the switch 290 described with reference to FIG. 5) might be not required. Further, the voltage generation circuit might not operationally affect other circuits disposed in the peripheral region of the memory device 150 or the memory die 200. The third and fourth multi-stage voltage pumps 250, 240 are always connected to the pin or pad 298 where the second power voltage VPP is supplied. The third and fourth multi-stage voltage pumps 250, 240 can be directly connected to the pin or pad 298 without any switching component. Thus, it is possible to advance the preparation time or the set-up period (Standby Period) without a wait time for a skew or a delay caused by the enable signal CE #. The third and fourth multi-stage voltage pumps 250, 240 can prepare the first pump generation voltage VPEPMP and the second pump generation voltage VPASSPMP in advance. In this case, a time (i.e., Section A1 described with reference to FIG. 3) required for generating the target voltage used for the data input/output operation can be significantly reduced.

Figure 7A:
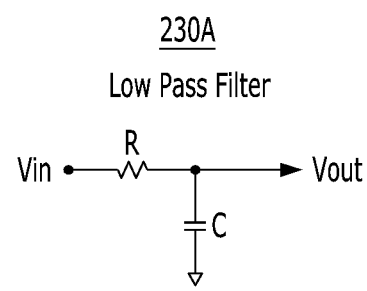
FIGS. 7A and 7B illustrate an example of a noise attenuation circuit according to an embodiment of the present disclosure.
Figure 7B:
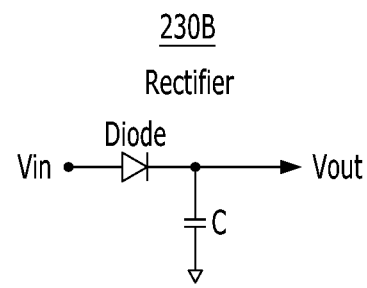

FIGS. 7A and 7B illustrates an example of a noise attenuation circuit according to an embodiment of the present disclosure.

Referring to FIGS. 7A and 7B, the noise attenuation circuit can be implemented in various circuits. For example, the noise attenuation circuit can include a low-pass filter 230A described in FIG. 7A and a rectifier 230B described in FIG. 7B. Herein, a noise may include a drop or fluctuation of the second power voltage VPP. The low-pass filter 230A can include a resistor R and a capacitor C, while the rectifier 230B can include a diode and a capacitor C. The low-pass filter 230A and the rectifier 230B may remove or attenuate a noise in an input signal or input voltage Vin to generate an output signal or output voltage Vout.

Both the low-pass filter 230A and the rectifier 230B can attenuate a noise such as a drop of the second power voltage VPP. However, there is a difference between the low-pass filter 230A and the rectifier 230B when a ripple occurs in an input voltage. For example, the resistor R in the low-pass filter 230A might not block a current flowing in a reverse direction, but the diode in the rectifier 230B can block the current flowing in the reverse direction. Accordingly, according to an embodiment, in order to efficiently cope with the ripple in the input voltage, the noise attenuation circuit 230 illustrated in FIG. 6 may include the rectifier 230B.

Figure 8:
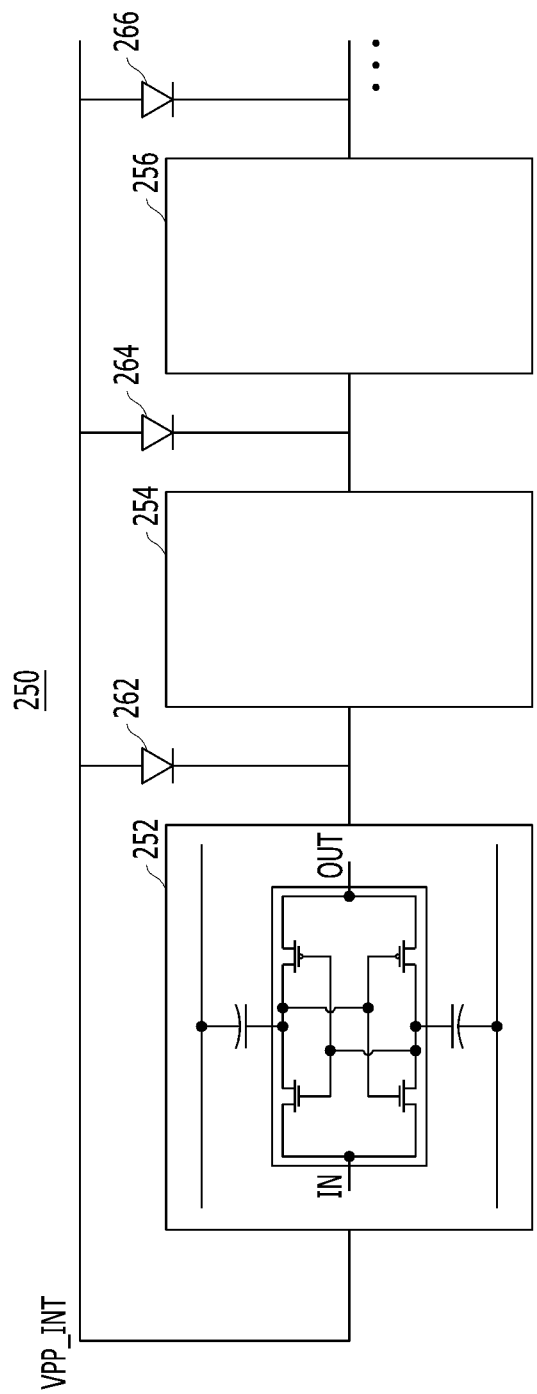
FIG. 8 illustrates an example of a multi-stage voltage pump according to an embodiment of the present disclosure.

FIG. 8 illustrates an example of a multi-stage voltage pump according to an embodiment of the present disclosure. Specifically, FIG. 8 shows an internal configuration of the third multi-stage voltage pump 250 described with reference to FIG. 6. The multi-stage voltage pump described with reference to FIG. 8 may also be applicable to the fourth multi-stage voltage pump 240.

Referring to FIG. 8, the third multi-stage voltage pump 250 may include a plurality of unit voltage pumps 252, 254, 256. The plurality of unit voltage pumps 252, 254, 256 included in the third multi-stage voltage pump 250 may be connected in series to each other, to generate target voltages having various voltage levels.

The second power voltage VPP may be applied to the noise attenuation circuit 230. The noise attenuation circuit 230 may attenuate the noise of the second power voltage VPP to generate a second internal power voltage VPP_INT. Referring to FIGS. 6 and 8, the second internal power voltage VPP_INT output from the noise attenuation circuit 230 is input to input terminals of the plurality of unit voltage pumps 252, 254, 256 included in the third multi-stage voltage pump 250.

The first and second multi-stage voltage pumps 282, 292 described with reference to FIGS. 4 to 5 may receive the first power supply voltage VCC and output a target voltage having a higher level than the first power supply voltage VCC. However, when the second internal power supply voltage VPP_INT is applied to the input terminals of the plurality of unit voltage pumps 252, 254, 256 included in the third multi-stage voltage pump 250, the input terminal and the output terminal of at least some unit voltage pumps included in the third multi-stage voltage pump 250 can be floating or become 0 V. For example, when the target voltage output from the first and second multi-stage voltage pumps 282, 292 does not have a higher voltage level than the second power voltage VPP, the input and output terminals between at least some unit voltage pumps among the plurality of unit voltage pumps 252, 254, 256 can be floating or become 0 V.

In order to reduce current consumption during operation and increase operation speed, each of the unit voltage pumps 252, 254, 256 may include a low-voltage pass transistor. However, when the second power voltage VPP_INT and a zero voltage 0V are individually applied to the input terminal and the output terminal of each of the unit voltage pumps 252, 254, 256, a voltage exceeding a range of the breakdown voltage of the low-voltage pass transistor may be applied to the low-voltage pass transistor included therein. The zero voltage 0V is an example of voltages which can be applied or maintained to the output terminal of the unit voltage pumps 252, 254, 256. Due to an operation skew of transistors, a voltage on the output terminal of the unit voltage pumps 252, 254, 256 might be leaked into another component electrically coupled to the output terminal of the unit voltage pumps 252, 254, 256. Or, a voltage level on the output terminal might be fluctuated to the output terminal of the unit voltage pumps 252, 254, 256. For example, a breakdown voltage of the low-voltage pass transistor may be about 3 to 5 V. When the voltage exceeding the range of the breakdown voltage of the low-voltage pass transistor is applied, the low-voltage pass transistor can be damaged or destroyed. Accordingly, for securing relaxation (e.g., to avoid a voltage gap or difference between an internal node and the input or output terminal of each unit voltage pump 252, 254, 256, which are determined by a voltage applied to the input or output terminal of each unit voltage pump 252, 254, 256, from exceeding the range of the breakdown voltage of the low-voltage pass transistor included in each of the unit voltage pumps 252, 254, 256), each diode 262, 264, 266 can be arranged in, or coupled to, an output terminal of each unit voltage pump 252, 254, 256. As shown in FIG. 8, an anode of each diode 262, 264, 266 may be coupled to the node of the second internal power voltage VPP_INT and a cathode of each diode 262, 264, 266 may be coupled between adjacent voltage pumps of the unit voltage pumps 252, 254, 256. In order to avoid a voltage difference caused by a voltage applied between the input or output terminal of each unit voltage pump 252, 254, 256 from exceeding the range of the breakdown voltage of the low-voltage pass transistor, each diode 262, 264, 266 can make the voltage level of the input terminal and the output terminal of each of the unit voltage pumps 252, 254, 256 stay at a certain level.

Figure 9:
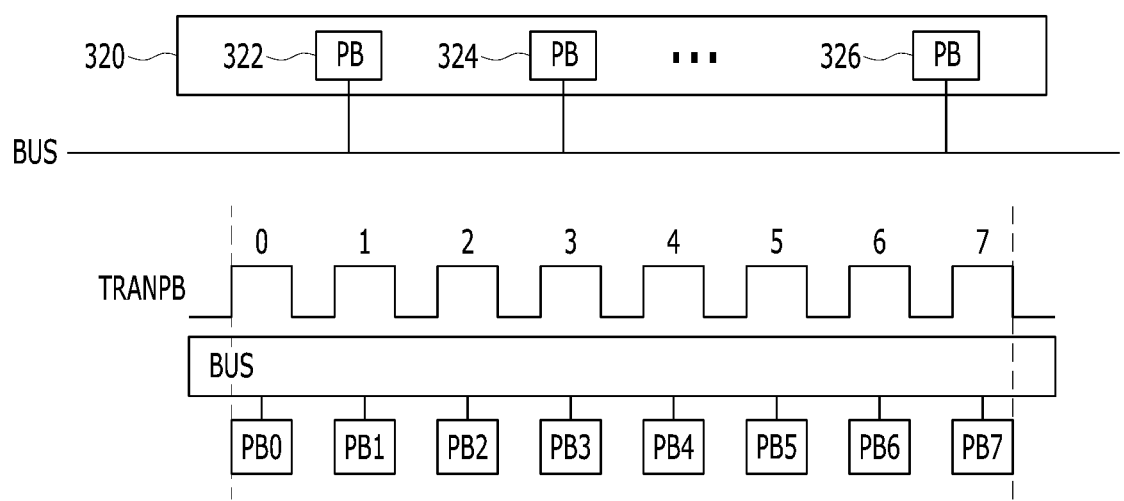
FIG. 9 illustrates a first example of page buffer and bus according to an embodiment of the present disclosure.

FIG. 9 illustrates a first example of page buffer and bus according to an embodiment of the present disclosure.

Referring to FIG. 9, a plurality of page buffers 322, 324, 326 included in the read/write circuit 320 in the memory die 200 described with reference to FIG. 1 may be connected to a single data bus BUS. The read/write circuit 320 can be configured to detect data transferred through each bit line BL, and store sensed data in each of the page buffers 322, 324, 326. Data stored in the plurality of page buffers 322, 324, 326 may be transmitted to a data input/output device or a transmission device such as a serialization circuit or a serializer through the single data bus BUS. Because the plurality of page buffers 322, 324, 326 are connected to the single data bus BUS, the plurality of page buffers 322, 324, 326 not only have to transmit data sequentially, but also individually have an operation margin for data transmission. The operation margin of each page buffer 322, 324, 326 should not be overlapped to avoid collision between data transmitted from the plurality of page buffers 322, 324, 326. According to an embodiment, there is a time gap between operation margins of neighboring page buffers. Accordingly, a page buffer transmission signal TRANPB applied to the plurality of page buffers 322, 324, 326 can have plural activation sections for activating each of the page buffers 322, 324, 326, as well as inactivation sections between the plural activation sections.

Figure 10:
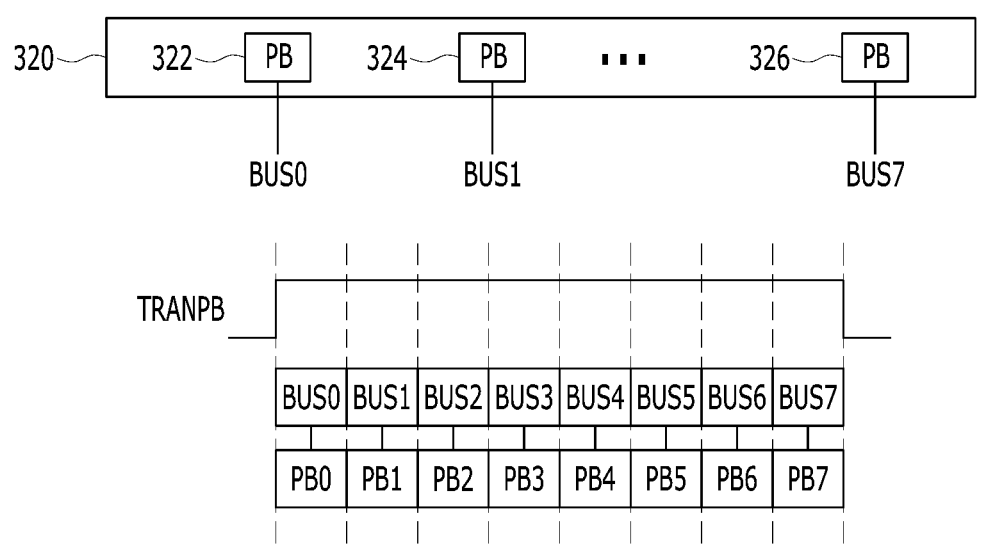
FIG. 10 illustrates a second example of the page buffer and the bus according to another embodiment of the present disclosure.

FIG. 10 illustrates a second example of the page buffer and the bus according to another embodiment of the present disclosure.

Referring to FIGS. 9 and 10, the plurality of page buffers 322, 324, 326 described in FIG. 10 may be transmitted to a data input/output device or a transmission device such as a serialization circuit or a serializer through a plurality of buses BUS0 to BUS7. In order for the plurality of page buffers 322, 324, 326 to sequentially transmit data, it could be sufficient that the page buffer transfer signal TRANPB has plural activation sections for sequentially activating the plurality of page buffers 322, 324, 326 without no inactivation section. That is, the page buffer transmission signal TRANPB does not have any inactivation section between neighboring activation periods. Because data is individually transferred through different data buses BUS0 to BUS7, each data bus connected to each of the plurality of page buffers 322, 324, 326, data cannot be overlapped or collapsed due to the different data buses BUS0 to BUS7. Accordingly, a delay time (i.e., an inactivation section) is not necessary. As the number of buses increases, a burden of arranging more wires in the memory die 200 occurs, but a time required for data transmission performed by the plurality of page buffers 322, 324, 326 can be reduced. Accordingly, it is possible to reduce a time spent on the operation (Sections D1, D2) of transmitting data temporarily stored in the page buffer PB, which is described with reference to FIG. 3.

As above-described, A memory device according to an embodiment of the present disclosure can improve data input/output speed.

In addition, an embodiment of the present disclosure can improve data input/output speed of the non-volatile memory device such as a flash memory, thereby replacing a storage class memory (SCM), demanding fast operation speed, or providing a non-volatile memory device applicable to the storage class memory (SCM) structure.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A voltage generation circuit, comprising:
    a noise attenuation circuit configured to attenuate a noise of a second power voltage which has a level that is at least two times higher than that of a first power voltage, wherein the first and second power voltages are individually input from an external device via different pins or pads; and
    a multi-stage voltage pump configured to receive a noise-attenuated second power voltage from the noise attenuation circuit and generate at least one of plural target voltages, each target voltage having a different level,
    wherein the multi-stage voltage pump comprises:
    plural unit voltage pumps serially connected to each other and configured to receive the second power voltage; and
    at least one diode including a cathode coupled between an output terminal and an input terminal of neighboring unit voltage pumps of the plural unit voltage pumps, and an anode coupled to the second power voltage, wherein the at least one diode is configured to maintain a voltage level on the output terminal and the input terminal of the neighboring unit voltage pumps to avoid application of a breakdown voltage of a transistor included in the neighboring unit voltage pumps.

2. The voltage generation circuit according to claim 1, wherein the noise attenuation circuit is always coupled to the pins or pads while the voltage generation circuit generates the at least one of the plural target voltages.

3. The voltage generation circuit according to claim 1, wherein the noise attenuation circuit comprises a rectifier including a diode arranged between input and output terminals, and a capacitor coupled to the output terminal.

4. The voltage generation circuit according to claim 1, wherein the noise attenuation circuit comprises a low pass filter including a resistor arranged between input and output terminals, and a capacitor coupled to the output terminal.

5. The voltage generation circuit according to claim 1, wherein the plural target voltages comprises:
    a program voltage used for programming a data item in a non-volatile memory cell;
    an erase voltage used for erasing the data item in the non-volatile memory cell; and
    a read voltage used for reading the data item in the non-volatile memory cell.

6. A memory device, comprising:
    a memory group including a plurality of non-volatile memory cells;
    a voltage generation circuit configured to generate at least one of plural target voltages used for inputting or outputting a data item to or from the memory group; and plural buffers configured to temporarily store the data item output from the memory group or to be input to the memory group, wherein the voltage generation circuit comprises:

a noise attenuation circuit configured to attenuate a noise of a second power voltage which has a level that is at least two times higher than that of a first power voltage, wherein the first and second power voltages are individually input from an external device via different pins or pads; and a multi-stage voltage pump configured to receive a noise-attenuated second power voltage from the noise attenuation circuit and generate the at least one of plural target voltages, each target voltage having a different level, wherein the multi-stage voltage pump comprises:

plural unit voltage pumps serially connected to each other and configured to receive the second power voltage; and at least one diode including a cathode coupled between an output terminal and an input terminal of neighboring unit voltage pumps of the plural unit voltage pumps, and an anode coupled to the second power voltage, wherein the at least one diode is configured to maintain a voltage level on the output terminal and the input terminal of the neighboring unit voltage pumps to avoid application of a breakdown voltage of a transistor included in the neighboring unit voltage pumps.

7. The memory device according to claim 6, wherein the noise attenuation circuit is always coupled to the pins or pads while the voltage generation circuit generates the at least one of the plural target voltages.

8. The memory device according to claim 6, wherein the noise attenuation circuit comprises a rectifier including a diode arranged between input and output terminals, and a capacitor coupled to the output terminal.

9. The memory device according to claim 6, wherein the noise attenuation circuit comprises a low pass filter including a resistor arranged between input and output terminals, and a capacitor coupled to the output terminal.

10. The memory device according to claim 6, wherein the plural target voltages comprises:

a program voltage used for programming a data item in a non-volatile memory cell;

an erase voltage used for erasing the data item in the non-volatile memory cell; and a read voltage used for reading the data item in the non-volatile memory cell.

11. The memory device according to claim 6, wherein the plural buffers are coupled to the first power voltage and a first ground voltage corresponding to the first power voltage, while the multi-stage voltage pump is coupled to the second power voltage and a second ground voltage corresponding to the second power voltage, and wherein a node of the first ground voltage is electrically isolated from a node of the second ground voltage.

12. The memory device according to claim 6, wherein the plural buffers are coupled to respective bit lines of the memory group, and wherein the plural buffers are coupled to respective buses to transfer the data item output from the memory group.

13. The memory device according to claim 12, wherein the plural buffers are coupled to a data serializer via the respective buses, and the plural buffers transfer the data item via the respective buses without any wait time.

14. A semiconductor device, comprising:

a first pin or pad configured to receive a first power voltage input from an external device;

a second pin or pad configured to receive a second power voltage input from an external device, wherein the second power voltage has a level that is at least two times higher than that of a first power voltage;

a multi-stage voltage pump configured to receive the second power voltage and generate at least one of plural target voltages, each target voltage having a different level; and a noise attenuation circuit, arranged between the second pin or pad and the multi-stage voltage pump and configured to attenuate a noise of the second power voltage wherein the multi-stage voltage pump comprises:

plural unit voltage pumps serially connected to each other and configured to receive a noise-attenuated second power voltage; and at least one diode including a cathode coupled between an output terminal and an input terminal of neighboring unit voltage pumps of the plural unit voltage pumps, and an anode coupled to the second power voltage, wherein the at least one diode is configured to maintain a voltage level on the output terminal and the input terminal of the neighboring unit voltage pumps to avoid application of a breakdown voltage of a transistor included in the neighboring unit voltage pumps.

* * * * *